(12) United States Patent
Ossimitz et al.

(10) Patent No.: US 9,299,673 B2
(45) Date of Patent: Mar. 29, 2016

(54) METHOD FOR MANUFACTURING A SEMICONDUCTOR CHIP WITH EACH CONTACT PAD HAVING A PAD CELL ASSOCIATED THEREWITH

(71) Applicant: Infineon Technologies AG, Neubiberg (DE)

(72) Inventors: Peter Ossimitz, Munich (DE); Matthias Von Daak, Markt Schwaben (DE); Dirk Hesidenz, Sauerlach (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/288,726

(22) Filed: May 28, 2014

(65) Prior Publication Data

US 2014/0264814 A1    Sep. 18, 2014

Related U.S. Application Data

(62) Division of application No. 13/371,853, filed on Feb. 13, 2012, now Pat. No. 8,779,577.

(51) Int. Cl.
*H01L 21/768* (2006.01)
*H01L 23/485* (2006.01)
(Continued)

(52) U.S. Cl.
CPC *H01L 24/09* (2013.01); *G11C 5/06* (2013.01); *H01L 22/32* (2013.01); *H01L 23/50* (2013.01); *H01L 23/5286* (2013.01); *H01L 24/03* (2013.01); *H01L 24/06* (2013.01);
(Continued)

(58) Field of Classification Search
CPC ......... H01L 24/09; H01L 24/03; H01L 24/85;
H01L 2224/09179; H01L 23/50; H01L 22/32;
H01L 23/5286; H01L 2224/48091; H01L
2224/05022; H01L 2224/05554; H01L
2224/06137; H01L 2224/06135; H01L
3334/48227; H01L 2224/05624; H01L
2224/05567; H01L 2224/05553; H01L
2924/10253
USPC ......... 257/784, 786, 208, 207, 203, 211, 676,
257/684, 691, 692, 606, 608, 774, E23.02,
257/E23.011, E21.59; 438/612, 121
See application file for complete search history.

(56) References Cited

U.S. PATENT DOCUMENTS 6,469,493 B1   10/2002   Muething et al.
8,778,577 B2 *  7/2014   Sasaki .............................. 430/7
(Continued)

OTHER PUBLICATIONS

Non-Final Office Action dated Jun. 5, 2013 for U.S. Appl. No. 13/371,853.
(Continued)

*Primary Examiner* — A O Williams
(74) *Attorney, Agent, or Firm* — Eschweiler & Associates, LLC

(57) ABSTRACT

Embodiments of the present invention relate to a semiconductor chip comprising a plurality of contact pads, which are arranged in an edge area on a surface of the semiconductor chip. In a semiconductor area of the semiconductor chip, every contact pad of the plurality of contact pads has an associated pad cell provided, which includes at least one of a driver or a receiver and is configured to drive output signals or receive input signals on its associated contact pad, if the driver or receiver is connected to the contact pad. Additionally, for a contact pad which is used as a supply contact pad, the driver or receiver of the associated pad cell is not connected to the contact pad or any other contact pad for driving output signals or receiving input signals on the same.

18 Claims, 13 Drawing Sheets

(51) Int. Cl.
*H01L 23/48* (2006.01)
*H01L 23/00* (2006.01)
*G11C 5/06* (2006.01)
*H01L 23/50* (2006.01)
*H01L 21/66* (2006.01)
*H01L 23/528* (2006.01)

(52) U.S. Cl.
CPC ............... *H01L 24/85* (2013.01); *H01L 24/05* (2013.01); *H01L 24/48* (2013.01); *H01L 2224/02166* (2013.01); *H01L 2224/02379* (2013.01); *H01L 2224/0392* (2013.01); *H01L 2224/0401* (2013.01); *H01L 2224/04042* (2013.01); *H01L 2224/05022* (2013.01); *H01L 2224/05147* (2013.01); *H01L 2224/05548* (2013.01); *H01L 2224/05553* (2013.01); *H01L 2224/05554* (2013.01); *H01L 2224/05567* (2013.01); *H01L 2224/05624* (2013.01); *H01L 2224/06135* (2013.01); *H01L 2224/06137* (2013.01); *H01L 2224/09179* (2013.01); *H01L 2224/48091* (2013.01); *H01L 2224/48227* (2013.01); *H01L 2224/85* (2013.01); *H01L 2924/00014* (2013.01); *H01L 2924/10253* (2013.01); *H01L 2924/3011* (2013.01)

(56) References Cited

U.S. PATENT DOCUMENTS

| | | | |
|---|---|---|---|
| 2005/0006726 A1* | 1/2005 | Ossimitz | 257/620 |
| 2008/0122080 A1 | 5/2008 | Lu et al. | |
| 2009/0127721 A1 | 5/2009 | Isono | |
| 2011/0090605 A1 | 4/2011 | Ito et al. | |
| 2012/0113552 A1 | 5/2012 | Ito et al. | |
| 2012/0211879 A1 | 8/2012 | Watanabe et al. | |

OTHER PUBLICATIONS

Notice of Allowance dated Mar. 4, 2014 for U.S. Appl. No. 13/371,853.

* cited by examiner

US 9,299,673 B2

METHOD FOR MANUFACTURING A SEMICONDUCTOR CHIP WITH EACH CONTACT PAD HAVING A PAD CELL ASSOCIATED THEREWITH

REFERENCE TO RELATED APPLICATION

This application is a divisional of U.S. application Ser. No. 13/371,853 filed on Feb. 13, 2012.

FIELD OF THE INVENTION

Embodiments of the invention are related to the field of semiconductor chips and semiconductor fabrication. Embodiments of the present invention relate to a semiconductor chip. Further embodiments of the present invention relate to a method for manufacturing such semiconductor chip. Further embodiments of the present invention relate to a device comprising a semiconductor chip. Further embodiments of the present invention relate to a method for manufacturing such device.

BACKGROUND

Complex devices, like "System on chip" (SoC) devices, have various functions like Logic, Analog, Power management and Memory. An interface to other external units these feature blocks can be connected to multiple device pins. For other components (e.g., DRAMS or Power IC's), such connections can be in the center of the die. Specially for high pin count devices like Logic or SoC, peripheral pads are also used. A chip having wire bond contacts needs supply terminals (supply pads) at an edge of the chip (in the so-called pad ring). In contrast to this, in the performance optimized integration of the voltage supply using the chip contact technology ("flip chip") the terminals for the voltage supply can be arranged out of the pad ring in an inner area of the chip, preferably at the power grit.

For using a semiconductor die for flip chip technology (e.g., for use in a BGA-Ball Grid Array package) and wire bond technology (e.g., for use in a QFP-Quad Flat Package), the area of the supply pads in the pad ring used in wire bond technology can not be used for I/O pads in the flip chip technology.

As an example, using this area for additional I/O pads or reducing the size of the pad ring, and therefore the size of a chip (e.g., by moving the supply pads out of the pad ring to a center of the semiconductor chip), leads to the problem that the silicon can no longer be used for wire bonding, e.g., in QFP packages.

SUMMARY

Embodiments of the present invention include a semiconductor chip having a plurality of contact pads are arranged in an edge area on a surface of the semiconductor chip. Furthermore, in a semiconductor area of the semiconductor chip, every contact pad of the plurality of contact pads has an associated pad cell provided. The pad cell includes at least one of a driver and a receiver, which is configured to drive output signals or receive input signals on its associated contact pad, if the driver or receiver is connected to the contact pad.

Additionally, for a contact pad which is used as a supply contact pad, the driver or receiver of its associated pad cell is not connected to the contact pad or another contact pad for driving output signals or receiving input signals on the same.

Further embodiments of the present invention provide a device comprising a housing with a plurality of inner housing terminals and an above described semiconductor chip, wherein at least a part of the plurality of contact pads of the semiconductor chip are wire bonded to at least a part of the inner housing terminals of the housing.

BRIEF DESCRIPTION OF THE DRAWINGS

Embodiments of the present invention will be described using the accompanying figures, in which.

DETAILED DESCRIPTION

The following embodiments of the present invention will be described in detail using the accompanying figures. It is noted that the same elements or elements having the same functionality are provided the same reference numbers and that a repeated description of elements provided with the same reference numbers is omitted. Hence, descriptions provided for elements having the same reference numbers are mutually exchangeable.

In the present application an input signal is to be understood as a data input signal and an output signal is to be understood as data output signal. In other words, the term input signal may be replaced by data input signal and the term output signal may be replaced by data output signal. Hence, an input signal and an output signal should not be understood as a supply potential or supply voltage.

Figure 1A:
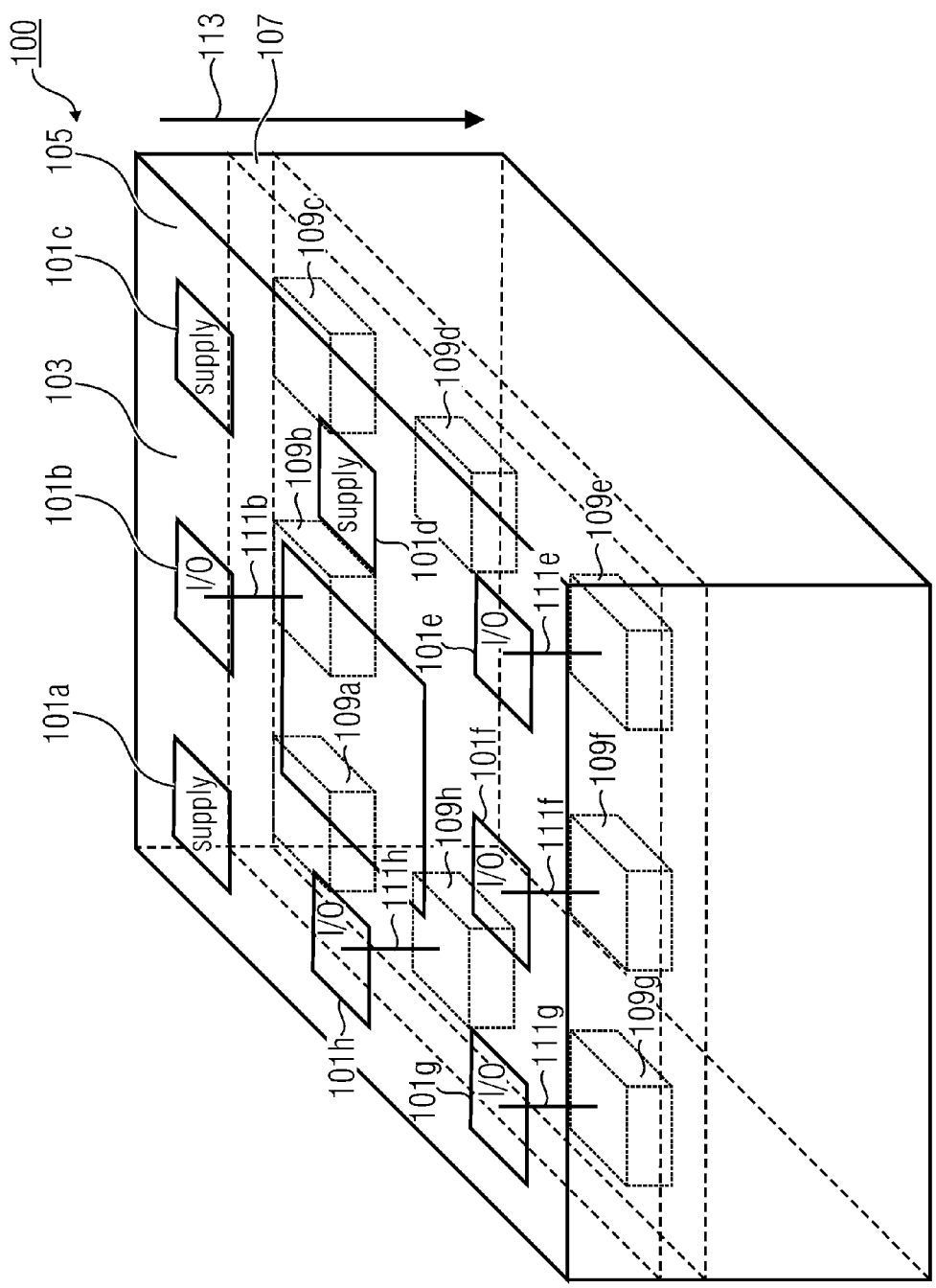
FIG. 1A shows a perspective view of a semiconductor chip according to an embodiment of the present invention.

FIG. 1a is a perspective view of a semiconductor chip 100 according to an embodiment of the present invention.

The semiconductor chip 100 comprises a plurality of contact pads 101a to 101h which are arranged in an edge area 103 on a surface 105 of the semiconductor chip 100.

Furthermore, an associated pad cell 109a-109h is provided in a semiconductor area 107 of the semiconductor chip 100 for every contact pad 100a-100h of the plurality of contact pads 100a-100h. Each pad cell 109a-109h comprises at least one of a driver or receiver which is configured to drive output signals and/or receive input signals on its associated contact pad 101a-101h if the driver and/or receiver of the associated pad cell 109a-109h is connected to the contact pad 100a-100h.

Furthermore, for a contact pad 101a, 101c, 101d, which is used as a supply contact pad 101a, 101c, 101d, a driver or receiver of its associated pad cell 109a, 109c, 109d is not connected to the contact pad 101a, 101c, 101d or any other contact pad 101b, 101e-101h for driving output signals or receiving input signals on the same.

As an example, a driver may comprise an analog or digital signal amplifier for amplifying analog or digital output signals and a receiver may comprise a comparator for digital input signals or an amplifier for digital or analog input signals.

As can be seen in the example from FIG. 1a, the contact pads 101a, 101c, 101d are used as supply contact pads 101a, 101c, 101d and the contact pads 101b, 101e-101h are used as input and/or output (I/O) contact pads, which are used for receiving and/or providing input and/or output signals (e.g., for analog signals and/or digital signals, e.g., USB-signals).

It is appreciated that the same semiconductor die (e.g., silicon die) can be used for flip chip technologies and wire bond technologies, if, for example, for every I/O contact pad an associated pad cell 109a-109h is provided (e.g., in an edge area of the semiconductor area 107) and if, when the semiconductor die is used as flip chip die each driver or receiver of a pad cell 109a-109h is connected to its associated contact pad, while, when the semiconductor die is used as wire bond die, only these drivers or receivers of the pad cells 109b, 109e-109h are connected to their associated contact pad 101b, 101e-101h for driving output signals or receiving input signals on its associated contact pad 101b, 101e-101h, if its associated contact pad 101b, 101e-101h is used as I/O contact pad. Hence, contact pads 101a, 101c, 101d which are used as supply contact pads 101a, 101c, 101d are not connected to the drivers or receivers of their associated pad cells 109a, 109c, 109d for driving output or receiving output signals on the supply contact pads 101a, 101c, 101d. These supply contact pads 101a, 101c, 101d may be connected to supply terminals or supply cells of the semiconductor chip 100 (e.g., of a semiconductor in a core area of the semiconductor area 107) for providing a supply voltage to the semiconductor chip 100.

In a flip chip implementation of the semiconductor die, additional contact pads can be provided in a core area of a surface of such a semiconductor chip, which may be connected to supply voltage terminals in a semiconductor area of the semiconductor chip.

In other words, in some embodiments of the present invention for each contact pad 101a-101h in the edge area 103 of the semiconductor chip 100 an associated I/O driver 109a-109h is provided These contact pads 101b, 101e-101h (and not other contact pads) are connected to a driver or receiver of their associated pad cells 109b, 109e-109h for driving output signals or receiving input signals, which are used as I/O contact pads 101b, 101e-101h. Drivers or receivers of pad cells 109a, 109c, 109d which are associated with contact pads 101a, 101c, 101e which are used as supply contact pads 101a, 101c, 101d are not connected to their associated contact pad 101a, 101c, 101d for driving output signals and/or receiving input signals on their associated contact pad 101a, 101c, 101d. But, as mentioned before, the supply contact pads 101a, 101c, 101d may be connected to (inner) supply terminals of the semiconductor chip 100 for providing a supply voltage to the semiconductor chip 100 (e.g., to integrated components or a semiconductor area in the semiconductor area 107).

Hence, when comparing the semiconductor area 107 of the semiconductor chip 100 shown in FIG. 1a (which can be used in a wire bond package as QFP) and an implementation of the semiconductor area 107 for a flip chip implementation, the semiconductor area 107 may be identical for flip chip and wire bond technology.

The only or one difference between the (wire bond) semiconductor chip 100 and the corresponding flip chip semiconductor chip may be that in the flip chip semiconductor chip the contact pads 101a, 101c, 101d are also used as (additional) I/O contact pads and may be connected to the drivers or receivers of their associated pad cells 109a, 109c, 109d.

Furthermore, the flip chip semiconductor chip can comprise additional contact pads (having the functionality of the supply contact pads 101a, 101c, 101d of the semiconductor chip 100) which may be arranged in a core area of the surface of the flip chip semiconductor chip. Hence, when compared to the semiconductor chip 100, the flip chip semiconductor chip may comprise more input/output contact pads as the semiconductor chip 100, as the flip chip technologies offers the possibility of placing contact pads not only in an edge area of the flip chip semiconductor chip, but also in a core area of the flip chip semiconductor chip. In the flip chip semiconductor chip the supply contact pads for the flip chip bumps may be arranged directly above the supply voltage network above the semiconductor area of the flip chip semiconductor chip. This network may be also called power mesh or power grid. While in the semiconductor chip 100 for wire bond the supply voltage network may be connected to the supply contact pads 101a, 101c, 101d via so-called power rails which may route the supply voltage signals from the supply network or power mesh to the supply contact pads 101a, 101c, 101e (arranged in the edge area 103 of the semiconductor 100).

To summarize, in the semiconductor chip 100 some of the available pad cells 109a, 109c, 109d in the semiconductor area 107 are not used for driving output and/or receiving output signals on any contact pads of the semiconductor chip 100, as the associated contact pads 101a, 101c, 101d, but are used as supply contact pads for receiving and/or providing supply voltages or supply potentials (which are not input signals or output signals).

As can be seen, for a flip chip design and a wire bond design the same semiconductor die (having the same semiconductor area 107) can be used, as the only difference between the flip chip implementation and the wire bond implementation can be found in the top layers of the semiconductor chip 100 (e.g., in the metal layers) in which a routing between the contact pads 101a-101h to their associated terminals in the semiconductor area 107 is different between the flip chip implementation and the wire bond implementation.

Hence, it is an advantage of the embodiments of the present invention that for two different implementations of a semiconductor chip one and the same semiconductor areas 107 or one and the same semiconductor (e.g., silicon) dies can be used, as the adaption to the technology (flip chip or wire bond) only happens in the last layers (e.g., in the metal layers). Hence, for the production of a semiconductor chip according to an embodiment of the present invention in the flip chip technology and the wire bond technology, one set of masks for producing the semiconductor die of this chip is sufficient, resulting in less design effort when compared to known concepts, in which for every implementation (wire bond or flip chip) for one semiconductor chip an own set of masks is needed.

To summarize, according to embodiments of the present invention, a flip chip design can be optimized to the used housing (e.g., BGA (flip chip technology) or QFP (wire bond technology)) in the last routing layers (e.g., in the metal routing layers of the semiconductor chip).

It has been found that the lower numbers of I/Os in the wire bond implementations (e.g., in QFP housings) is an unused area which can be used now for connecting the supply voltages by a wire bond.

As mentioned before, the adaption to the housing type happens mainly in the topmost metal layers and by means of via stacks (which may lead from a contact pad to the associated I/O driver).

Embodiments of the present invention have the advantage that no silicon area in the area of the pad ring for different housing types is wasted.

Embodiments enable the optimization of a chip area and developing efforts by using a base chip design for different types of housings, pin associations and contact technologies by having different variants, preferably in the topmost layers of the chip.

In the following, some optional features of embodiments of the present invention shall be described using the example shown in FIG. 1a.

In the example shown in FIG. 1a the semiconductor chip 100 comprises eight contact pads 101a-101h and eight pad cells 109a-109h. According to further embodiments of the present invention, the number of contact pads and the number of pad cells may be arbitrary, wherein for each contact pad (at least) one associated pad cell is provided which is configured to drive output signals or receive input signals on its associated contact pad, if its driver or receiver is connected to the associated contact pad for driving output signals or receiving input signals.

According to further embodiments of the present invention the pad cells 109a-109h may be arranged in an edge area of the semiconductor area 107 (which may surround a core area of the semiconductor area 107).

Furthermore, as can be seen from FIG. 1a, for every contact pad 101a-101h, the associated pad cell 109a-109h may lie at least partially in a projection of the contact pad 101a-101h. Such a projection may, for example, be in a layer staple direction 113, which may extend from the surface 105 of the semiconductor chip 100 to the semiconductor area 107. In the example shown in FIG. 1a the layer staple direction of the semiconductor chip 100 is visualized with an arrow 113. Furthermore, an area of a contact pad 101a-101h may be larger than an area of its associated pad cell 109a-109h.

According to another embodiment of the present invention, contact pads 101b, 101e-111h, which are used as I/O contact pads may be connected through contacts 111b, 111e-111h to the drivers or receivers of their associated pad cells 109b, 109e-109h. Such a contact (through contact) 111b, 111e-111h may extend between the surface 105 and the semiconductor area 107, e.g., from a contact pad 101b, 101e-101h on the surface 105 of the semiconductor chip 100 to an associated pad cell 109b, 109e-109h in the semiconductor area 107 of the semiconductor chip 100.

As an example, such a through contact 111b, 111e-111h may extend in the layer staple direction 113 of the semiconductor chip 100. For contact pads 101a, 101c, 101d, which are used as supply contact pads, these through contacts may be omitted. Instead of this, the contact pads 101a, 101c, 101d may be connected to or coupled to other parts or components in the semiconductor area 107 (e.g., for providing a supply voltage).

Such a through contact, for example, may be or may comprise a via, a via stack or a large opening.

In the present application, a coupling between two nodes can be a direct low Ohmic coupling and/or an indirect coupling with one or more elements in between, such that a signal at a second node is dependent on a signal at a first node, which is coupled to the second node. In other words, passive and/or active elements may be arranged between two terminals that are coupled with each other. Furthermore, according to the present application, a first terminal is connected to a second terminal if a signal at the second terminal is identical to a signal at the first terminal, wherein parasitic effects or small losses based on trace or via impedances are not considered. Hence, two terminals which are connected to each other are typically connected via traces, wires or via stacks without additional elements in between.

As can be seen from FIG. 1a, according to at least some embodiments of the present invention, in the layer staple direction 113 of the semiconductor chip 100 no further semiconductor layer may be arranged between a layer of the contact pads 101a-101h (which may be a top layer of the semiconductor chip 100) and a layer of the semiconductor area 107 in which the I/O drivers 109a-109h are arranged in.

As an example, the pad cell 109a-109h may comprise an input comparator unit (e.g., the receiver), an output driver unit (e.g., the driver) and further more an ESD protection circuit. Also configurations on the driver strength and a variation on the input signal load conditions may be applied.

According to further embodiments a driver or receiver of a pad cell (e.g., the pad cell 109a) may be connected to its associated contact pad (e.g., the contact pad 101a), which is used as supply contact pad for sensing a supply voltage applied at the contact pad. As an example, the receiver (or a comparator of the receiver) of the first pad cell 109a may be connected to the first contact pad 101a for voltage level sensing on the supply pin or supply contact pad 101a. In other words, a contact pad which is used as supply contact pad may comprise a dedicated multi-function with its associated pad cell, in that the contact pad is used for receiving a supply voltage or supply potential and the pad cell of this contact pad is used for sensing in parallel a voltage level of this supply voltage or supply potential.

According to further embodiments, as described, a pad cell may comprise or include an ESD protection circuit. A contact pad which is used as supply contact pad may be connected to the ESD protection circuit of its associated pad cell (while the driver or receiver of the associated pad cell is not connected to the contact pad for driving output signals or receiving input signals on the same). By connecting a contact pad, which is used as supply contact pad to the ESD protection circuit of its associated pad cell, an ESD protection can be achieved at the supply pads (in the edge area of the semiconductor chip) and rather than at the power mesh (in a core area of the semiconductor chip). Hence, by using the ESD protection circuit of a pad cell, even power rails for routing the supply voltage or supply potential from the contact pad to the power mesh can be ESD protected.

According to some embodiments some contact pads may be redundant contact pads (e.g., one supply rail supports 2 contact pads) e.g., to reduce a current density on a pad or a bond wire by using multiple bond wires.

According to further embodiments a semiconductor chip may comprise dummy contact pads, with no associated pad cell.

Figure 1B:
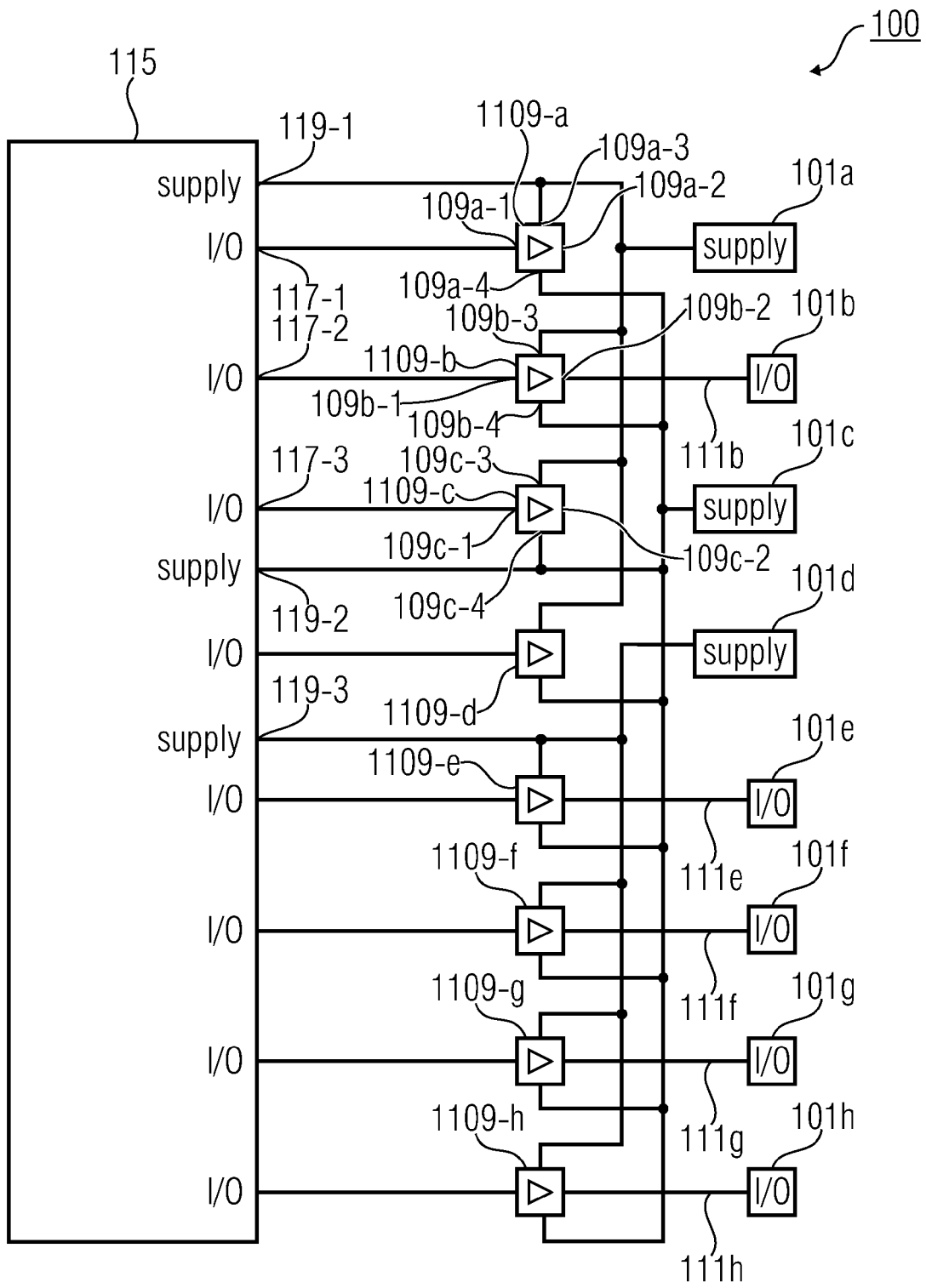
FIG. 1B shows an equivalent circuit as an example for connections of the contact pads of the semiconductor chip shown in FIG. 1a, according to an embodiment of the present invention.

According to further embodiments a supply voltage or supply potential can be also connected through a via stack or through contact from Power traces (e.g., Power ring) near the pad cell FIG. 1b shows in an equivalent circuit as an example for possible connections of the contact pads 101a-101h to the drivers and/or receivers of the their associated pad cells 109a-

109*h* and to a semiconductor core 115 of the semiconductor chip 100. The connections shown in FIG. 1*b* are only shown as an example in order to facilitate an understanding of the plurality of possibilities for the connections of the contact pads 101*a*-101*h* to the drivers and receivers of the pad cells 109*a*-109*a* and the semiconductor core 115. According to further embodiments, other connections between these elements are contemplated and may vary, for example, according to the application of the semiconductor chip 100.

As a pad cell may comprise a driver and/or a receiver, in the following the general term I/O driver is used. Such an I/O driver may comprise a driver for driving output signals and may comprise a receiver for receiving input signals, but may also comprise either a receiver or a driver. It is assumed that each pad cell 109*a*-109*h* comprises at least one such I/O driver 1109*a*-1109*h* shown in the following. Hence each I/O driver 1109*a*-1109*h* is associated to the contact pad 101*a*-101*h* which is associated to the pad cell 109*a*-109*h* which comprises the I/O driver 1109*a*-1109*h*.

In the example shown in FIG. 1*b*, each I/O driver 1109*a*-1109*h* may comprise two supply terminals, at which it receives two supply potentials and two I/O terminals at which it receives and/or provides input and/or output signals.

As an example shown in FIG. 1*b*, a first I/O driver 1109*a* may comprise a first I/O terminal 109*a*-1, a second I/O terminal 109*a*-2, a first supply terminal 109*a*-3 and a second supply terminal 109*a*-4.

In the example shown in FIG. 1*b*, the first I/O terminal 109*a*-1 is coupled to a first core I/O terminal 117-1 of the semiconductor core 115 for providing input signals to the first core I/O terminal 117-1 and/or for receiving output signals from the first core I/O terminal 117-1. Furthermore, as can be seen from FIG. 1*b*, the second IO terminal 109*a*-2 of the first I/O driver 1109*a* is not connected to its associated contact pad 101*a* (which is used as a supply contact pad), as it is also shown in FIG. 1*a*. The same applies for the other supply contact pads 100*c*, 100*d*, as these are not connected or coupled to the second I/O terminals of their associated I/O drivers 1109*c*, 1109*d*.

In contrast to this, a second I/O terminal 109*b*-2 of a second I/O driver 1109*b* is connected via a second via stack 111*b* to its associated second contact pad 101*b*, which is used as an I/O contact pad for driving input and/or output signals on the second contact pad 101*b*.

The same applies to the other contact pads 101*e*-101*g*, which are used as I/O contact pads and their associated I/O drivers 1109*e*-1109*h*.

However, as can be seen from FIG. 1*b*, it is furthermore possible that a contact pad 101*a*, 101*c*, 101*d*, which is used as supply contact pad can be coupled with at least one I/O driver of the plurality of I/O drivers of the semiconductor chip 100, for providing a supply potential to this I/O driver.

As an example, such a contact pad may be directly connected to a supply terminal of an I/O driver or (indirectly) coupled to the supply terminal of the I/O driver (for example, having a supply voltage generator or similar in between).

In the example shown in FIG. 1*b* the first contact pad 101*a* is coupled with first supply terminals of the I/O driver 1109*a*-1109*d*. As an example, the first contact pad 101*a* is even coupled to the first supply terminal 109*a*-3 of its associated I/O driver 1109*a*, for providing a first supply potential to its associated first I/O driver 1109*a*. Furthermore, the first contact pad 101*a*, which is used as a supply contact pad, may also be coupled to an I/O driver of the plurality of I/O drivers which is not associated with the first contact pad 101*a* for driving input and/or output signals on the first contact pad 101*a*. As an example, the first contact pad 101*a* is also coupled to a first supply terminal 109*b*-3 of the second I/O driver 1109*b*, which is associated with the second contact pad 101*b* and is configured to drive input and/or output signals on its associated second contact pad 101*b* (as it is connected to the second contact pad 101*b*).

According to further embodiments of the present invention, a contact pad that is used as supply contact pad can be coupled with an I/O driver of a plurality of I/O drivers to provide a supply potential to the I/O driver. This I/O driver is associated with a further contact pad, which is used as a further supply contact pad and wherein this I/O driver is not connected to the further contact pad or any other contact pads driving input signals and/or output signals on the same.

As an example, as can be seen from FIG. 1*b*, the first contact pad 101*a* may be coupled to a first supply terminal 109*c*-3 of a third I/O driver 1109*c* which is associated with a third contact pad 101*c*, which is used as supply contact pad. As can be seen from FIG. 1*b*, a second I/O terminal 109*c*-2 of the third I/O driver 1109*c* is not connected or coupled to its associated contact pad 101*c*, but a first I/O terminal 109*c*-1 of the third I/O driver 1109*c* is coupled to a third core I/O terminal 107-3 of the semiconductor core 115.

Furthermore, a first I/O terminal 109*d*-1 of the second I/O driver 1109*b* is coupled to a second core I/O terminal 117-2 of the semiconductor core 115 for providing input signals received at the second contact pad 101*d* to the semiconductor core 115 and/or for receiving output signals provided at the second core I/O terminal 117-2 from the semiconductor core 115. The second I/O driver 1109*b* may be configured to drive this output signals received at the first I/O terminal 109*b*-1 on its associated second contact pad 101*b*.

Furthermore, as can be seen from FIG. 1*b* each I/O driver may be connected to at least two different supply contact pads for receiving at least two different supply potentials (e.g., a high potential and a reference potential). In the example of FIG. 1*b* the third contact pad 101*c* may be configured to provide such a reference potential to the second supply terminals (109*a*-4, 109*b*-4, 109*c*-4) of the plurality of I/O drivers 109*a*-109*h*.

According to further embodiments, the semiconductor chip 100 may comprise supply contact pads of different categories (e.g., for different supply potential types). As an example, a first supply contact pad may be configured to receive a supply potential for an analog part and/or a first voltage of the semiconductor chip 100, while another supply contact pad is configured to receive a supply potential for a digital part and/or a second voltage of the semiconductor chip 100.

As an example, shown in FIG. 1*b*, the first contact pad 101*a*, which is used as supply contact pad 101*a* is coupled to the I/O drivers 1109*a*-1109*d*, while the fourth contact pad 101*d*, which is also used as supply contact pad, is coupled to the I/O drivers 1109*e*-1109*h*.

As an example, the first contact pad 101*a* may be configured to provide a supply potential for a digital part and/or a first voltage of the semiconductor chip 100, while the fourth contact pad 101*d* may be configured to provide supply potential for an analog part and/or a second voltage of the semiconductor chip 100.

Hence, the I/O drivers 1109*a*-1109*h* (e.g., the drivers and/or receivers of the I/O drivers) may be configured to provide and/or receive digital and/or analog input and/or output signals.

In the example shown in FIG. 1*b* the I/O drivers 1109*a*-1109*d* may be configured to receive and/or provide digital input and/or output signals. Additionally, the I/O drivers 1109e-1109h may also be configured to receive and/or provide analog input and/or output signals.

According to further embodiments, the supply contact pads 101a, 101c, 101d (or at least a part of them) may be coupled to the semiconductor core 115.

In the example shown in FIG. 1b, the first contact pad 101a is coupled to a first core supply terminal 119-1 of the semiconductor core 115 for providing a first supply potential, such as a digital supply potential, to the core 115, the third contact pad 101c is coupled to the second core supply terminal 119-2 of the semiconductor core 115 for providing a reference potential (e.g., ground potential) to the semiconductor core 115 and the fourth contact pad 101d is coupled to a third core supply terminal 119-3 of the semiconductor core 115 for providing a second (analog) supply potential to the semiconductor core 115.

As described above the plurality of pad cells 109a-109h may be arranged in the semiconductor area 107 of the semiconductor chip 100. Each of such pad cells 109a-109h may comprise at least one of the I/O drivers 1109a-1109h associated with the contact pads 101a-101h. In other words, each contact pad 101a-101h is associated with at least one pad cell 109a-109h comprising at least the I/O driver 1109a-1109h (each comprising a driver and/or a receiver) associated with this contact pad 101a-101h. Such an pad cell 109a-109h may comprise further functions, like the signal driving function (realized by the I/O drivers 1109a-1109h), an ESD protection (e.g., realized by ESD protection circuits) and/or a pad logic.

Thus, according to some embodiments of the present invention, such a pad cell may comprise a pad driver and/or receiver (in general an I/O driver), a pad logic and ESD structures, which are realized in the semiconductor area 107 of the semiconductor chip 100.

According to some embodiments of the present invention, a pad cell of the plurality of pad cells may comprise a first driver or receiver, which is configured to drive output signals or receive input signals on a first contact pad associated with the pad cell, if the first driver is connected to the first contact pad. Furthermore, the pad cell may comprise a second driver or receiver, which is configured to drive output signals or receive input signals on a second contact pad which is also associated with the pad cell, if the second driver or receiver is connected to the second contact pad. Thus, according to some embodiments of the present invention, a pad cell may comprise more than one driver or receiver, e.g., two drivers and/or two receivers, which are associated with two different contact pads. In one example, such a pad cell may be a differential pad cell, for example, for receiving and/or providing differential input and/or output signals.

As described before, some of the drivers and/or receivers of the semiconductor chip 100 may not be connected to their associated contact pad for driving output signals or receiving input signals on the same, as their associated contact pad is used as a supply contact pad.

In one example, the contact pad is associated with the first driver or receiver of the pad cell is used as a supply contact pad. Then, the first driver or receiver may not be connected to this first contact pad for driving output signals or receiving input signals on this first contact pad. Hence, the pad cell cannot be used as a differential pad cell, as at least one part signal cannot be provided or received anymore, as the contact pad needed for this is not connected to its associated driver or receiver. Hence, the second driver or receiver of the pad cell is not connected to the second contact pad for driving output signals or receiving input signals on the second contact pad. Thus, the second contact pad may be used also as a supply contact pad. To summarize, according to embodiments of the present invention, a driver or receiver of a pad cell is not connected to the associated contact pad and another driver or receiver of the same pad cell is also not connected to its associate contact pad. Furthermore, if a contact pad associated with a pad cell is used as supply contact pad, also a further contact pad associated with this pad cell may be used as supply contact pad.

Figure 1C:
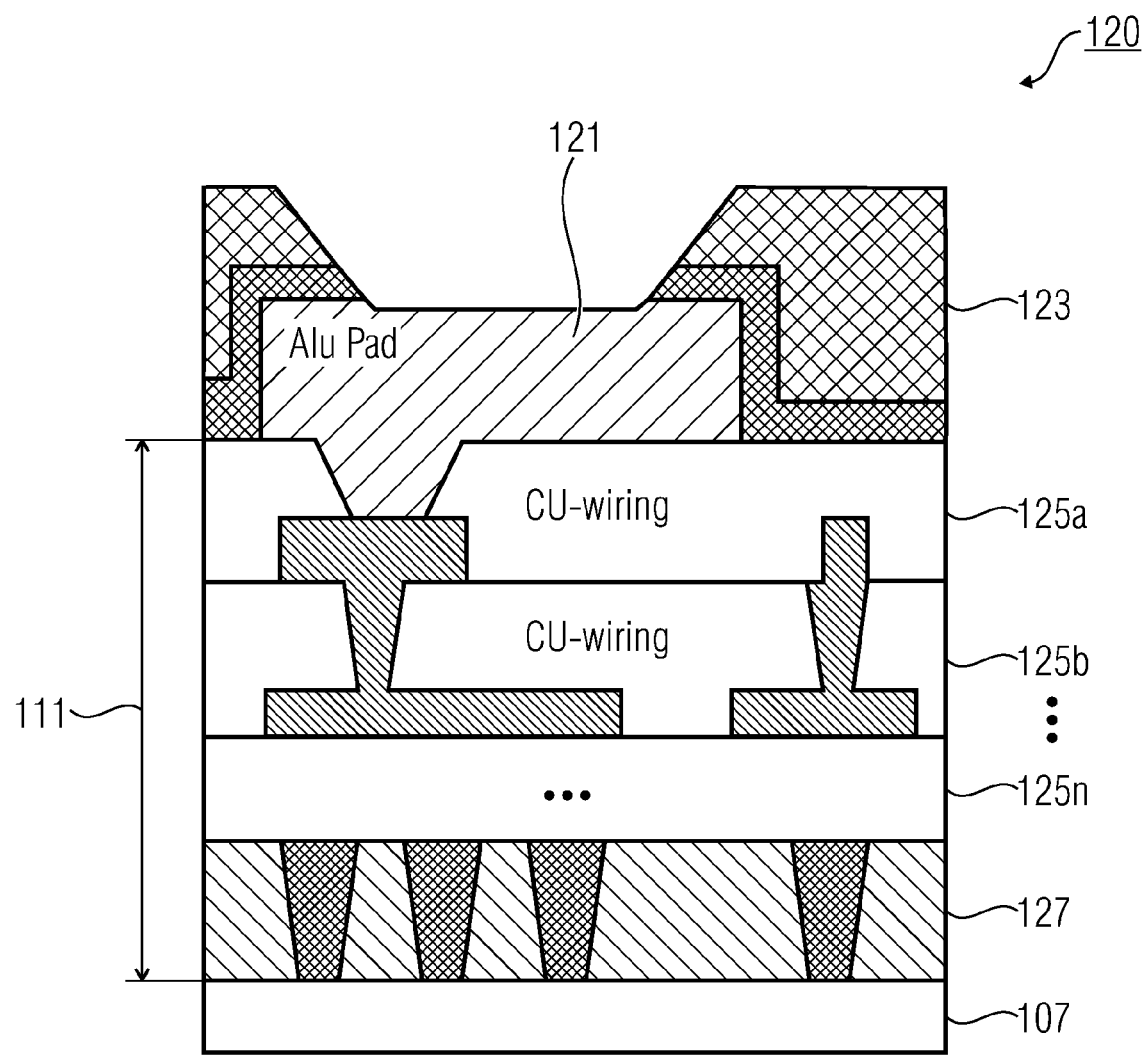
FIG. 1C shows an example for a metal layer stack how it may be used in the semiconductor chip shown in FIG. 1a according to an embodiment of the present invention.

FIG. 1c shows a metal layer stack 120 how it may be used in the semiconductor chip 100 for establishing connections from the contact pads 101a-101h to the drivers and/or receivers of their associated pad cells 109a-109h and/or to the semiconductor core 115 of the semiconductor chip 100.

The metal layer stack 120 shown in FIG. 1c comprises a pad opening 121, e.g., at the surface 105 of the semiconductor chip 100, an optional Imide layer 123, multiple power and signal routing layers 125a-125n and a via layer 127 which extends from a last metal layer 125n metal to silicon (to the semiconductor area 107).

A through contact, e.g., a via stack, from a contact pad to an associated pad cell (for example the via stack 111b) extends from the pad opening 121 to the semiconductor area 107. This is shown by the arrow 111 which extends from the pad opening 121 to the semiconductor area 107. As described before, the contact pads which are not used as supply contact pads are connected to the drivers or receivers of their associated pad cells drivers by means of through contacts. Hence, for the contact pads 101a, 101c, 101d, which are used as supply contact pads 101a, 101c, 101d, the associated through contact (when available) stops before it reaches the associated pad cell 109a, 109c, 109d in the semiconductor area 107.

As an example, upper layers of the power and signal routing layers (e.g., the layer 125a) may be different for a wire bond implementation (e.g., as shown in FIG. 1a) and for a flip chip implementation, as some of the via stacks which are provided in the flip chip implementation for connecting contact pads with the drivers and/or receivers of associated pad cells may be omitted in the wire bond implementation. Instead of this, in the wire bond implementation further power rails (as part of a power mesh) may be provided for connecting the contact pads 101a, 101c, 101d, which are used as supply contact pads, to supply terminals of the semiconductor core 115 of the semiconductor chip 100. Furthermore, lower layers (e.g., the layer 125b) of the multiple power and signal routing layers in the metal layer stack 120 may be identical for the wire bond implementation and the flip chip implementation.

According to further embodiments, also the vias from the last metal layer, (e.g., layer 125n) to the silicon or the semiconductor area 107 can be the same for both interconnect options (for wire bond and flip chip).

FIG. 2 is a diagram showing an example of a pad reassignment that enables almost the same silicon die for flip chip technology and wire bond technologies (e.g., the flip chip technology is used in BGA packages whereas wire bond technology is used in QFP packages) in accordance with an embodiment of the invention. FIG. 2 includes portions 2(a), 2(b), 2(c) and 2(d).

Figure 2A:
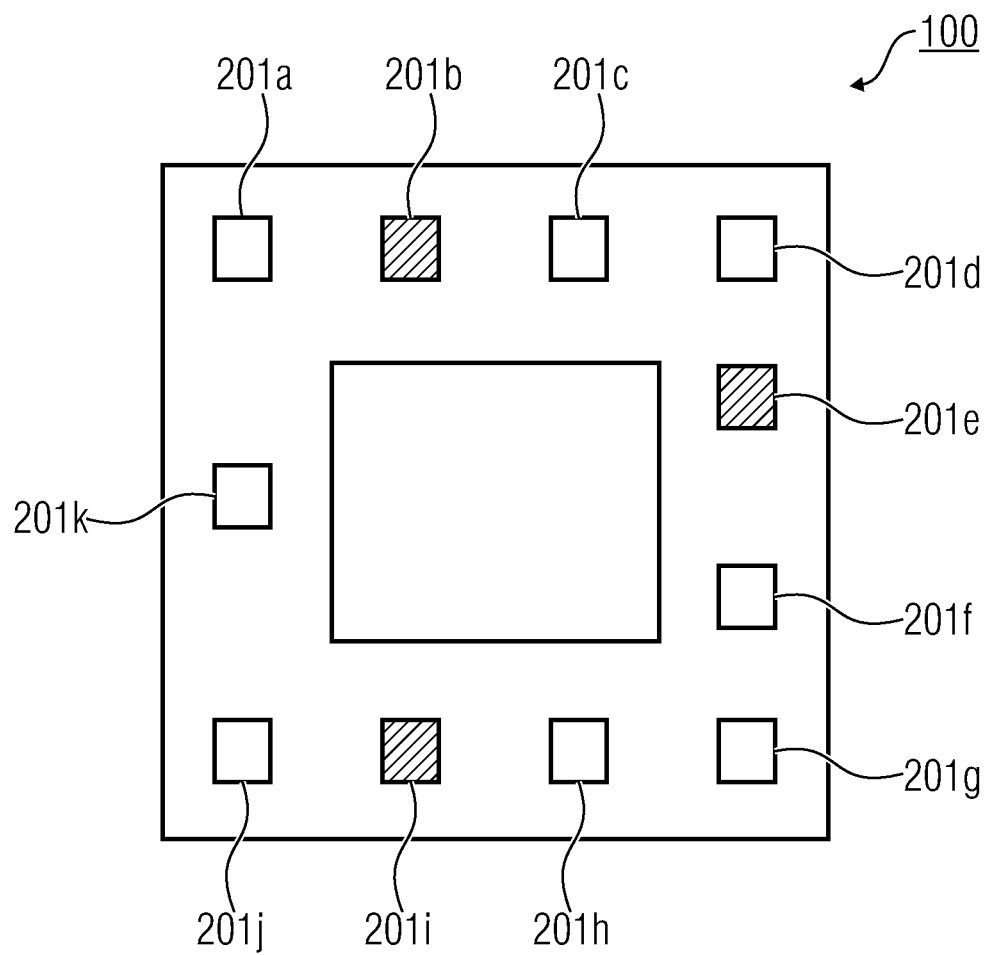
FIGS. 2A-2D provide an illustration that shows how a pad reassignment enables almost the same silicon for a flip chip package (e.g., BGA) and a wire bond package (e.g., QFP) according to an embodiment of the present invention.

FIG. 2(a) shows a top view on a conventional pad frame with a plurality of contact pads 201a-201k, in which contact pads 201b, 201e, 201i, which are used as supply contact pads are marked with hatched lines.

The conventional pad frame shown in FIG. 2(a) can be used for wire bond technologies, as all contact pads 201a-201k are arranged in an edge area or in a so-called pad ring of the conventional pad frame.

Figure 2B:
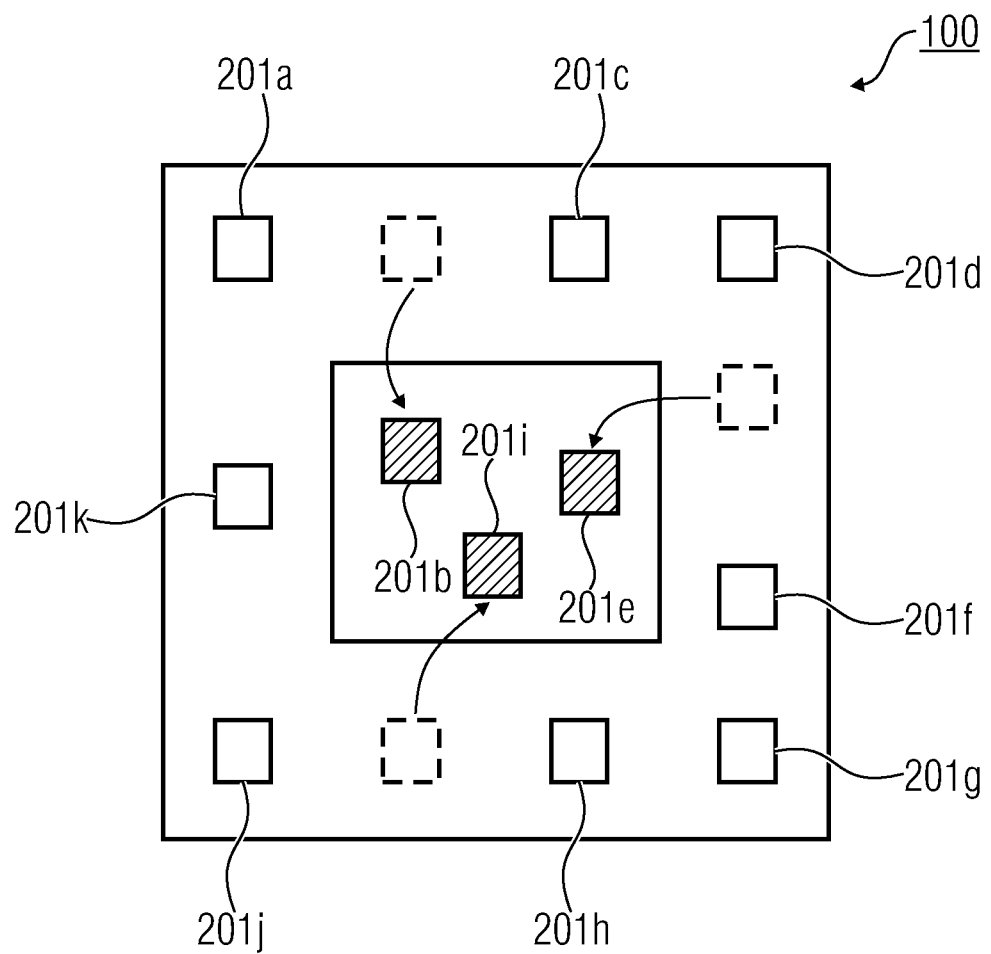
Figure 2C:
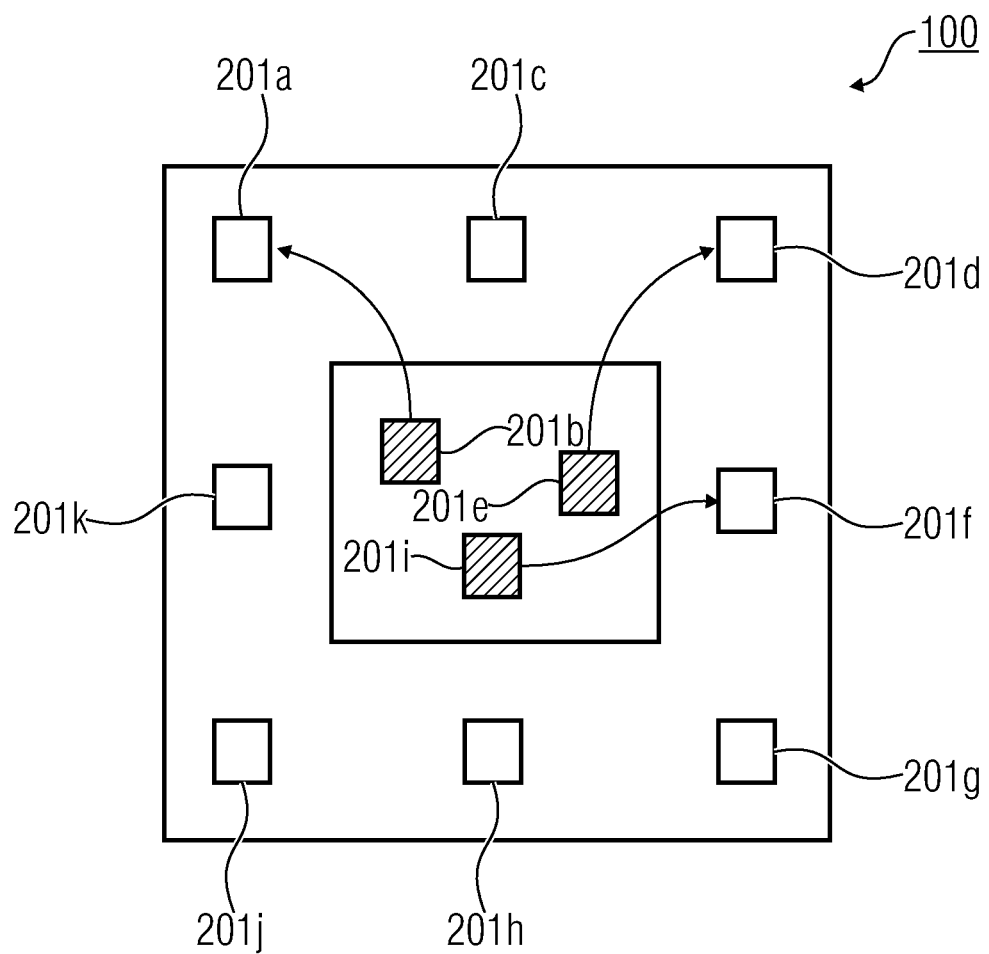

FIG. 2(b) shows how the supply pads 201b, 201e, 201i can be moved to a chip center for a flip chip technology, as in flip chip technology it is possible to contact not only contact pads in an edge area of the pad frame, but also in the center area. FIG. 2(c) shows the conventional flip chip, which has the same number of contact pads as the conventional pad frame for the flip chip technology, but has a smaller area consumption, as not only the pad ring is used for the contact pads but also the chip center or a chip core.

Figure 2D:
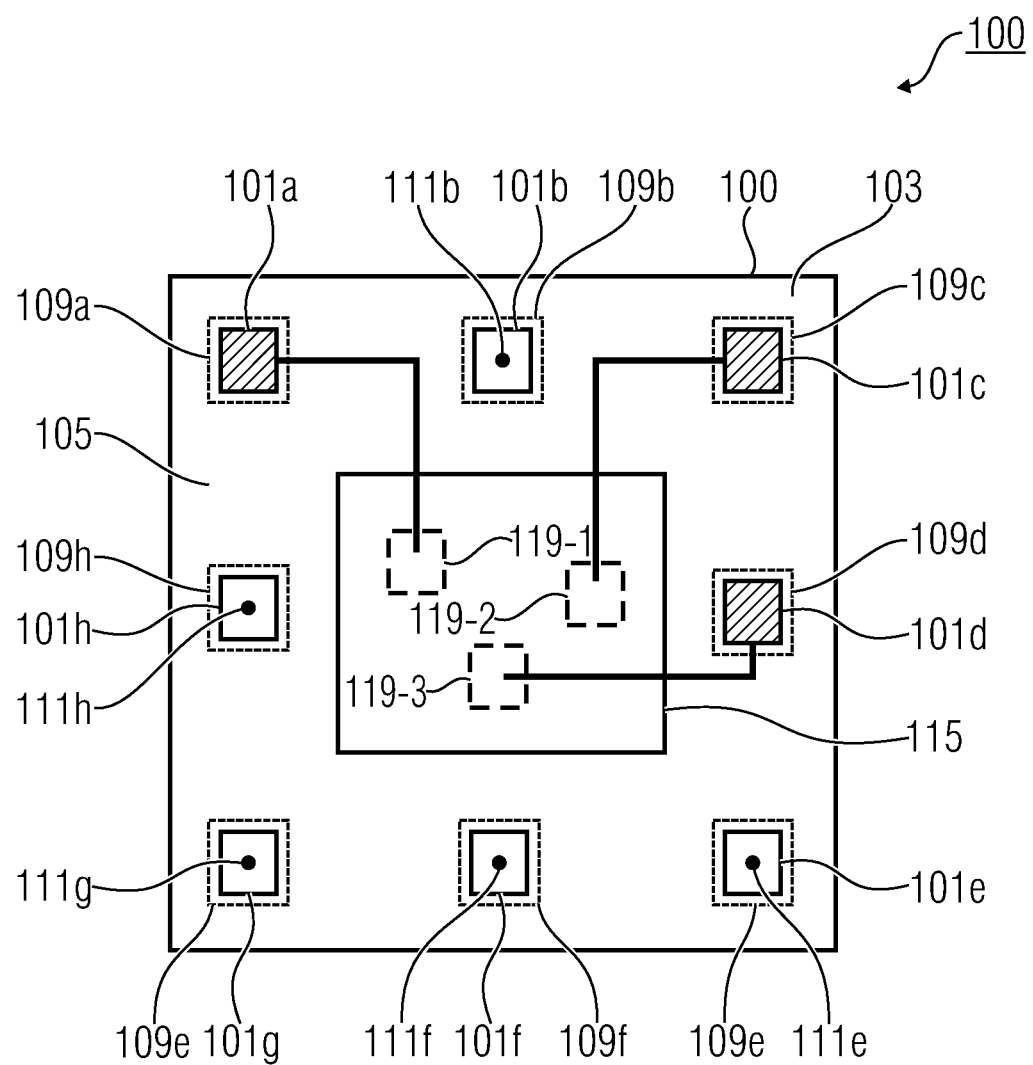

In FIG. 2(c), the die frame can also be used for the wire bond technology, according to embodiments of the present invention. In this example unused I/O pad 101a, 101c, 101e are reassigned as supply pads for the flip chip technology (or QFP version), e.g., in a second metal layer. As an example, the contact pad 201b, which is used as a supply contact pad, is reassigned to the contact pad 201a. Additionally, the contact pad 201e, which is used as supply contact pad, is reassigned to the contact pad 201d. Further, the contact pad 201i, which is used as a supply contact pad, is reassigned to the contact pad 201f. These three reassignments can happen in a metallization layer of the semiconductor chip 100 as shown in FIG. 2(d). Hence, a silicon die used for the chip as shown in FIG. 2(c) can be the same as the silicon die used for the semiconductor chip 100 shown in FIG. 2(d). The difference between the chip shown in FIG. 2(c) and the semiconductor chip 100 shown in FIG. 2(d) is that the semiconductor chip 100 has less I/O contact pads, as some of its (original) I/O contact pads are reassigned to supply contact pads which are in the chip shown in FIG. 2(c) placed in a center area of the surface of the chip.

Furthermore, from FIG. 2(d) it can be seen that the contact pads 101a, 101c, 101d, which are used as supply contact pads, can be connected to the semiconductor core 115 of the semiconductor chip 100 (e.g., in a metal layer of the semiconductor chip 100).

Furthermore, it can be seen that the contact pads 101b, 101e-101h, which are used as I/O contact pads, are connected by means of via stacks 111b, 111e-111h to their associated pad cell 109b, 109e-109h for driving output signals or receiving input signals.

As an example, the contact pads 101a, 101c, 101d, which are used as supply contact pads 101a, 101c, 101d may be coupled by a low Ohmic connection to the power mesh of the semiconductor chip 100, which comprises a plurality of power rails.

From FIG. 2 it can be seen that a silicon or semiconductor area 107 of the semiconductor chip 100 is designed such that every contact pad 101a-101h can be used as I/O pads wherein during a last production step (e.g., after the production of the silicon die has been finished) of the semiconductor chip 100, only the contact pads which are used as I/O contact pads are connected to their associated I/O drivers, which are needed as I/O contact pads. The contact pads, which are used as supply contact pads are not connected to the drivers or receivers of their associated pad cells for driving output signals or receiving input signals on the same.

It is noted that an area of a contact pad may be larger than an area of its associated I pad cell.

Furthermore, the contact pads can be arranged in two columns (or in an inner ring and in an outer ring).

Furthermore, a pad cell can lie in a projection (e.g., in a layer staple direction of the semiconductor chip) of its associated contact pad. According to further embodiments, a regular offset for a certain group of contact pads is possible. As an example, the projection mentioned above may be also from an angle different to 90 degree. Furthermore, according to further embodiments of the present invention, more than one I/O driver or pad cell can lie in the projection of one contact pad, wherein at least one of these I/O drivers or pad cells is associated with the contact pad in which projection they lie.

Furthermore, the contact pads can be connected (e.g., via power rails of a power mesh) to supply terminals (e.g., of a semiconductor core of a semiconductor chip). Furthermore, more than one pad cell may lie in the projection of a contact pad, which is used as supply contact pad, wherein none of the drivers or receivers of these pad cells are connected to an associated contact pad for driving output signals or receiving input signals in the same.

Furthermore, it is appreciated that a number of pad cells may be larger than a number of contact pads of a semiconductor chip.

To summarize, embodiments of the present invention allow use of the same semiconductor die can be used for two different semiconductor chips for two different contact technologies (like wire bond design and flip chip design).

FIG. 3 is a diagram showing an alternate implementation for the contact pads 101a-101h. Although, only the contact pad 101a is shown in FIG. 3 these implementations can be used for the other contacts pad 101b-101h also. FIG. 3 is shown with portions (a), (b), (c), and (d).

Figure 3A:
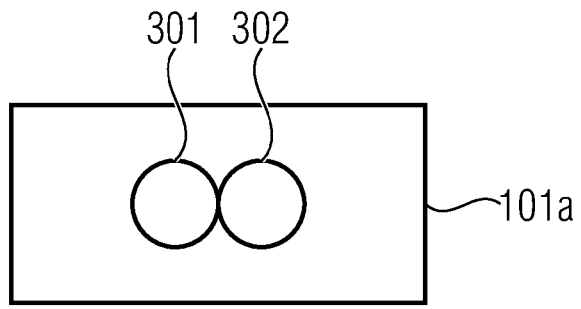
FIGS. 3A-3D show different possible implementations for contact pads of a semiconductor chip according to the present invention.

FIG. 3(a) shows a first example implementation of the contact pad 101a comprising a bond area 301 and a probe area 302, which are conductively connected in layer of the contact pad 101a. Typically the bond area 301 is used for connecting wires between the die of the semiconductor chip and a housing of the semiconductor chip. The probe area 302 is used during manufacturing for testing the functionalities of the semiconductor chip.

Figure 3B:
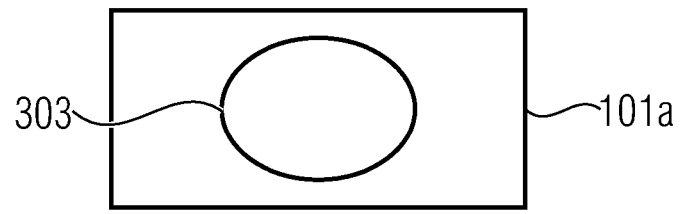

FIG. 3(b) shows a second example implementation of the contact pad 101a with a common bond and probe area 303.

Figure 3C:
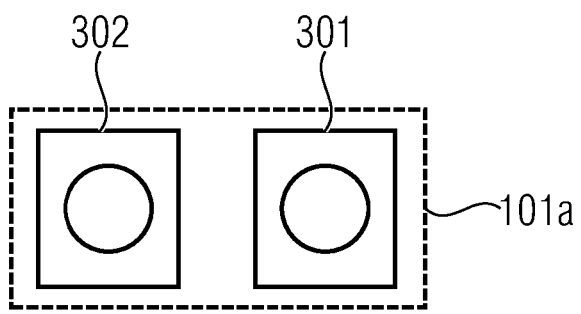

FIG. 3(c) show a third example implementation of the contact pad 101a with the bond area 301 and the probe area 302, wherein the bond area 301 and the probe area 302 are electrically isolated in the layer of the contact pad 101a, but may be conductively connected in other layers of the semiconductor chip.

Figure 3D:
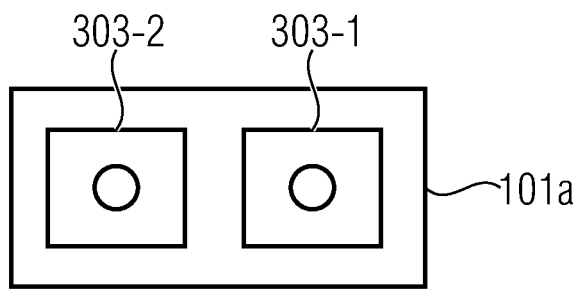

FIG. 3(d) shows a fourth example implementation of the contact pad 101a with a first common bond and probe area 303-1 and a second common bond and probe area 303-2, which are in the layer of the contact pad 101a isolated from each other. The plurality of common bond and probe areas 303-1, 303-2 enable the connection of plurality of wires to the contact pad 101a.

In other words, a contact pad of one I/O contact can comprise 2 separated areas: the probe area 302 for wafer test (probing, temporary device interconnect) and the bond area 301 for wirebonding or bumping (permanent device interconnect).

These areas 301, 302 on the contact pads can be defined side by side, overlapped, or some times separated into 2 pads.

Figure 4A:
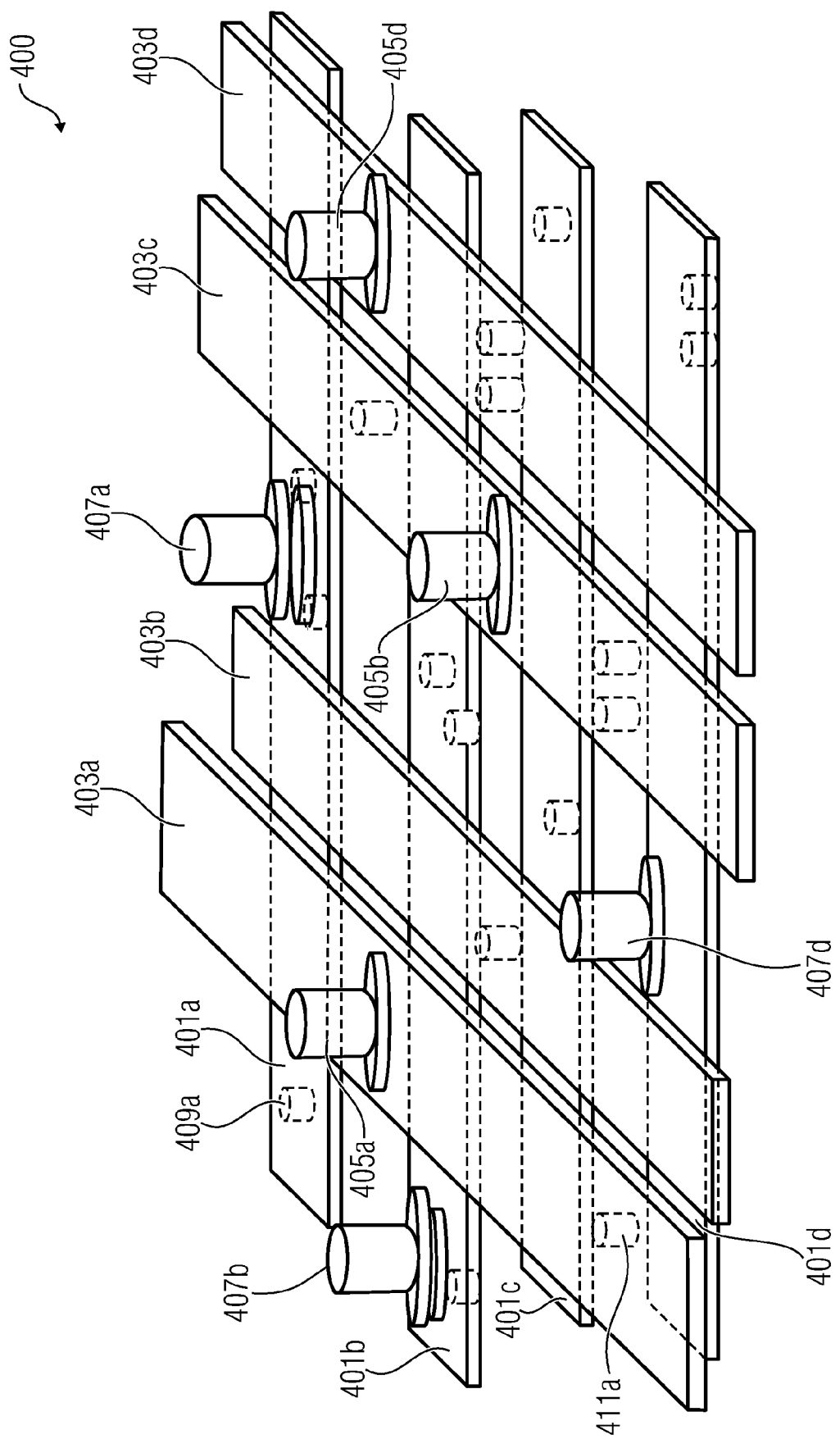
FIG. 4A shows examples for flip chip bumps on a power mesh according to an embodiment of the present invention.

FIG. 4a shows a schematic illustration of a power mesh 400 and how it can be used in the semiconductor chip 100 shown in FIG. 1a, e.g., for connecting the contact pads 101a, 101c, 101d, which are used as supply contact pads, to supply terminals of the semiconductor core 115 and/or to supply terminals of the drivers or receivers of the pad cells 109a-109h.

In the example shown in FIG. 4a, a plurality of power traces 401a-401d for a reference potential (e.g., ground potential or VSS) extends in a first lateral direction of the power mesh and another plurality of power rails 403a-403d for a supply potential (e.g., VDD) extends in a second lateral direction of the power mesh, which is orthogonal to the left lateral direction.

The example shown in FIG. 4a shows a plurality of flip chip bumps on the power grit 400 or power mesh 400 for connecting the power rails 401a to 401d, 403a to 403d to a package substrate. In the example shown in FIG. 4a a first power bump 405a for connecting a first power rail 403a for the supply potential, a second power bump 405c for connecting a third power rail 403c for the supply potential and a third power bump 405d for connecting a fourth power rail 403d for the supply potential are shown.

Furthermore, FIG. 4a also shows a fourth power bump 407a for connecting a first power rail 401a for the reference potential, a fifth power bump 407b for connecting a second power rail 401b for the reference potential and a sixth power bump 407d for connecting a fourth power rail 401d for the reference potential are shown.

The power bumps 405a-407d form interconnections of their connected power rail 401a-403d to the package substrate.

Furthermore, several VSS vias to lower layers are shown (e.g., a first VSS via 409a of the first power rail 401a) for the reference potential. Furthermore, several VDD vias to lower layers are shown (for example a first VDD via 411a of the first power rail 403a) for the supply potential.

The flip chip bumps shown in FIG. 4a can be omitted in wire bond designs, as typically in wire bond designs, wires are connected to contact pads in an edge area of the semiconductor chip and not to the flip chip bumps.

Figure 4B:
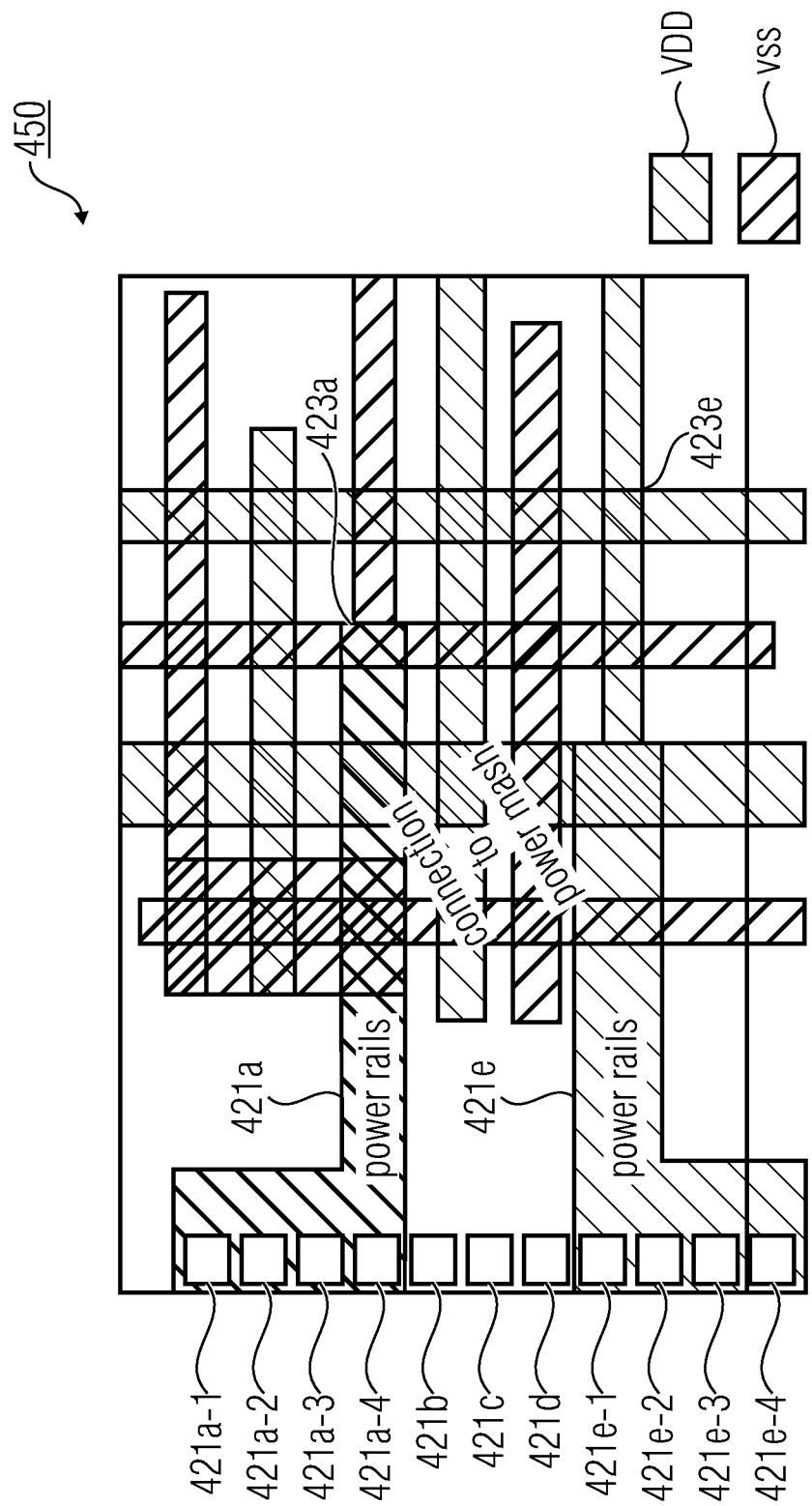
FIG. 4B is a schematic illustration of a top view on a semiconductor chip according to an embodiment of the present invention.

Hence, FIG. 4b shows how in a semiconductor chip according to an embodiment of the present invention contact pads, which are used as supply contact pads, can be connected to such a power mesh.

FIG. 4b shows a top view on a semiconductor chip 450 according to a further embodiment of the present invention. The semiconductor chip 450 includes contact pads 421a-1 to 421a-4, 421e-1 to 421e-4, which are used as supply contact pads and further contact pads 421b to 421d which are used as I/O contact pads. As can be seen from FIG. 4b a first plurality of contact pads 421a-1 to 421a-4 which are used as supply contact pads are connected via a first power rail 421a to a first power mesh 423a, e.g., for a reference potential VSS. Furthermore, a second plurality of contact pads 421e-1 to 421e-4 which are used as supply contact pads are connected via a second power rail 421e to a second power mesh 423e, e.g., for a supply potential VDD. The first power mesh 423a and the second power 423e mesh are marked in FIG. 4b with different hatches. Furthermore, according to some embodiments of the present invention, the first power mesh 423a is isolated from the second power mesh 423e. As an example, the first power mesh 423a may be connected to one or more first supply terminal(s) of the semiconductor core of the semiconductor chip 450 which are configured to receive the reference potential VSS. The second power mesh 423 may be connected to one or more second supply terminal(s) of the semiconductor core, which are configured to receive the supply potential VDD.

Such power meshes as shown in FIG. 4b can be also used in the semiconductor chip 100 shown in FIG. 1 for connecting the contact pads 101a, 101c, 101d which are used as supply contact pads 101a, 101c, 101d e.g., to a semiconductor core of the semiconductor chip 100.

In other words, according to embodiments of the present invention a contact pad used as a supply contact pad can be connected by a power mesh in the metallization layers of the semiconductor chip to a supply terminal, e.g., in a central or core area of the semiconductor area of the semiconductor chip.

Furthermore, such a power mesh can be arranged between the surface of the semiconductor chip and the semiconductor area of the semiconductor chip.

According to further embodiments, a projection of the edge area (e.g., in a layer staple direction of the semiconductor chip) in which the contact pads are arranged, can laterally surround a center or core area of the semiconductor area (in which for example a semiconductor core may be arranged).

Figure 5:
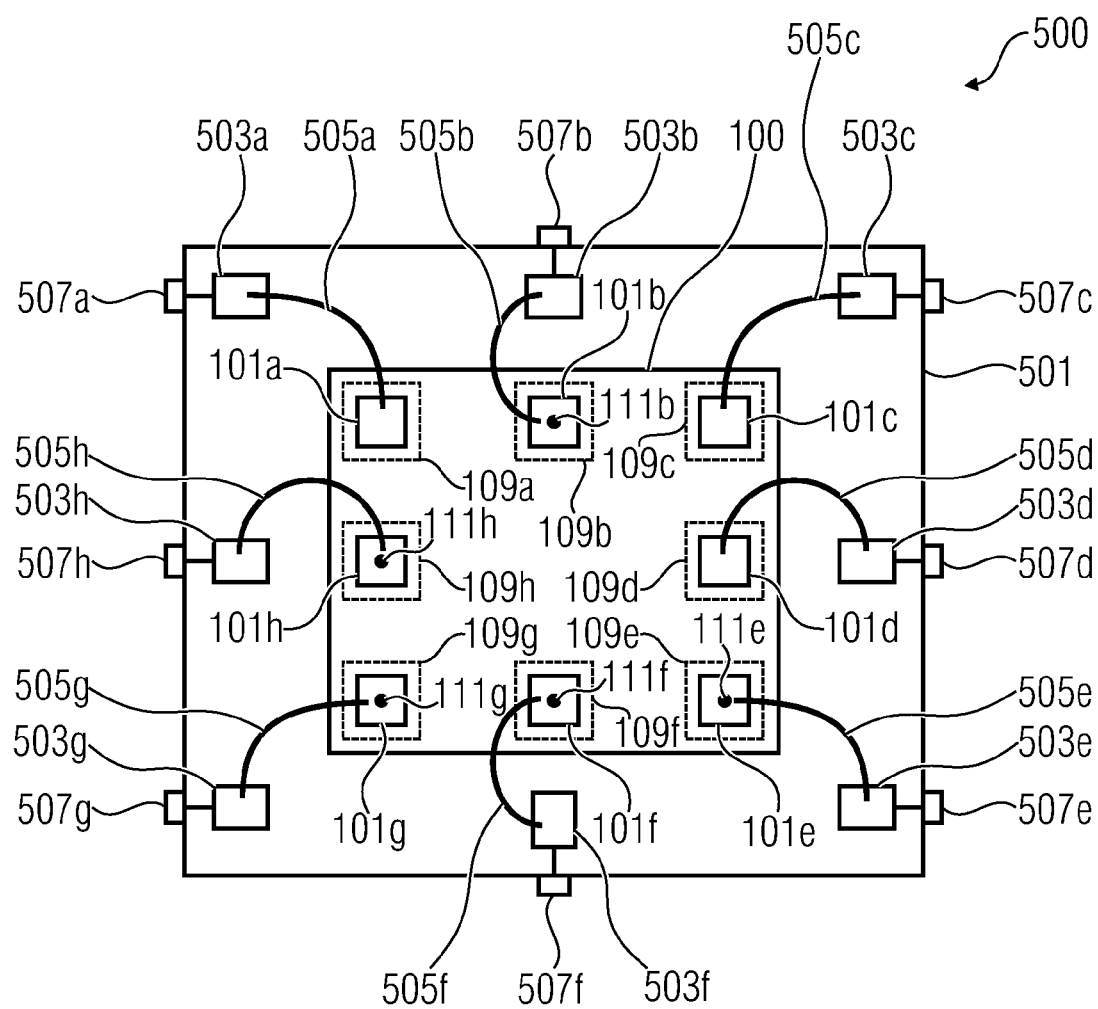
FIG. 5 is a schematic illustration of a device according to an embodiment of the invention.

FIG. 5 shows a device 500 according to an embodiment of the present invention.

The device 500 comprises a housing 501 with a plurality of inner housing terminals 503a-503h. Furthermore, the device 500 includes a semiconductor chip according to an embodiment of the present invention. In the example shown in FIG. 5, the device 500 includes the semiconductor chip 100 shown in FIG. 1a.

Furthermore, each contact pad 101a-101h of the semiconductor chip 100 is wire bonded to an inner housing terminal 503a-503h of the semiconductor chip 500.

According to further embodiments of the present invention, it is also possible that only a part of the contact pads of the semiconductor chip is wire bonded to inner housing terminals of a device. Furthermore, it is also possible that the number of contact pads and the number of inner housing terminals are different from each other.

As can be seen from FIG. 5, each contact pad 101a-101h is connected to an inner housing terminal 503a-503h by means of a wire 505a-505h.

As mentioned before, for a wire bond implementation and a flip chip implementation, the same semiconductor die may be used, wherein a flip chip semiconductor chip may have typically a higher number of contact pads, and therefore a higher number of possible I/O, when compared to its corresponding wire bond semiconductor chip (e.g., the semiconductor chip 100).

Nevertheless, using one and the same semiconductor die for two different contact technologies has the advantage that one mask set for producing the semiconductor die is sufficient for both contacting technologies, as the adaption to wire bond or flip chip can only happen in the top layers of the corresponding semiconductor chip (e.g., in the metal layers).

As an example, the housing 501 can be a QFP package (QFP-quad flat package).

According to further embodiments, as can be seen from FIG. 5, the housing 501 can comprise a plurality of outer housing terminals 507a-507h which are conductively connected to the inner housing terminals or in other words, each outer housing terminal 507a-507h can be conductively connected to at least one inner housing terminal 503a-503h. The outer housing terminal 507a-507h, for example, can include pins or solder contacts.

In the following, some aspects of embodiments of the present invention shall be summarized.

Embodiments of the present invention enable more I/Os in a pad ring for BGA implementation with flip chip for a pad limited design or alternatively a smaller chip area because of a less area consumption of the pad ring.

According to further embodiments of the present invention, also a re-routing of pad openings in an area outside the pad ring may be possible; such a pad opening may be placed at different places for flip chip and wire bond. In other words, especially for flip chip implementations, contact pads or pad openings from the pad ring may be re-routed into a center area of the surface of a semiconductor chip, which then can be used as flip chip. In contrast to this, in conventional semiconductor chips, a position of I/O pad openings and at least some supply pads are solely defined in the area above the pad logic and their supply busses within the pad ring.

Figure 6:
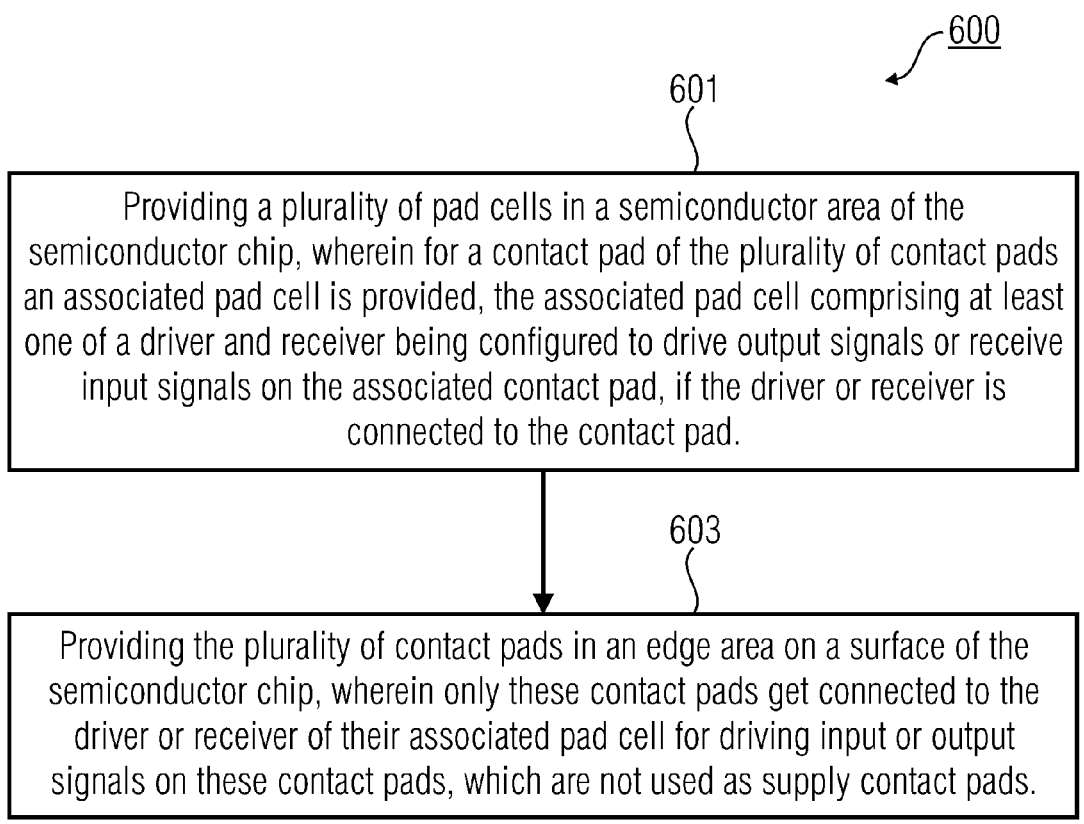
FIG. 6 is a flow diagram of a method for manufacturing a semiconductor chip according to an embodiment of the present invention.

FIG. 6 is a flow diagram showing a method 600 for manufacturing a semiconductor chip comprising a plurality of contact pads. The method 600 can be used, for example, for manufacturing the semiconductor chip 100 according to FIG. 1.

The method 600 comprises a block or step 601 of providing a plurality of pad cells in a semiconductor area of the semiconductor chip. For a (or every) contact pad of the plurality of contact pads, an associated pad cell is provided. The associated pad cell includes at least one of a driver and a receiver and is configured to drive output signals or receive input signals on the associated contact pad, if the driver or receiver is connected to the contact pad.

Furthermore, the method 600 continues with block or step 603, to provide the plurality of contact pads in an edge area on a surface of the semiconductor chip. Only these contact pads get connected to the driver or receiver of their associated pad cells for driving output signals or receiving input signals on these contact pads, which are not supply contact pads.

According to further embodiments of the present invention, during the step 603, a plurality of through contacts can be provided, wherein the plurality of through contacts are configured to route input or output signals from the pad cells to the associated contact pads or from the contact pad to the associated pad cells. The through contacts are (only) provided at pad cells which are not associated with contact pads used as supply contact pads.

In other words, a through contact between a contact pad and its associated pad cell may be provided only if the contact pad is not used as a supply contact pad.

Figure 7:
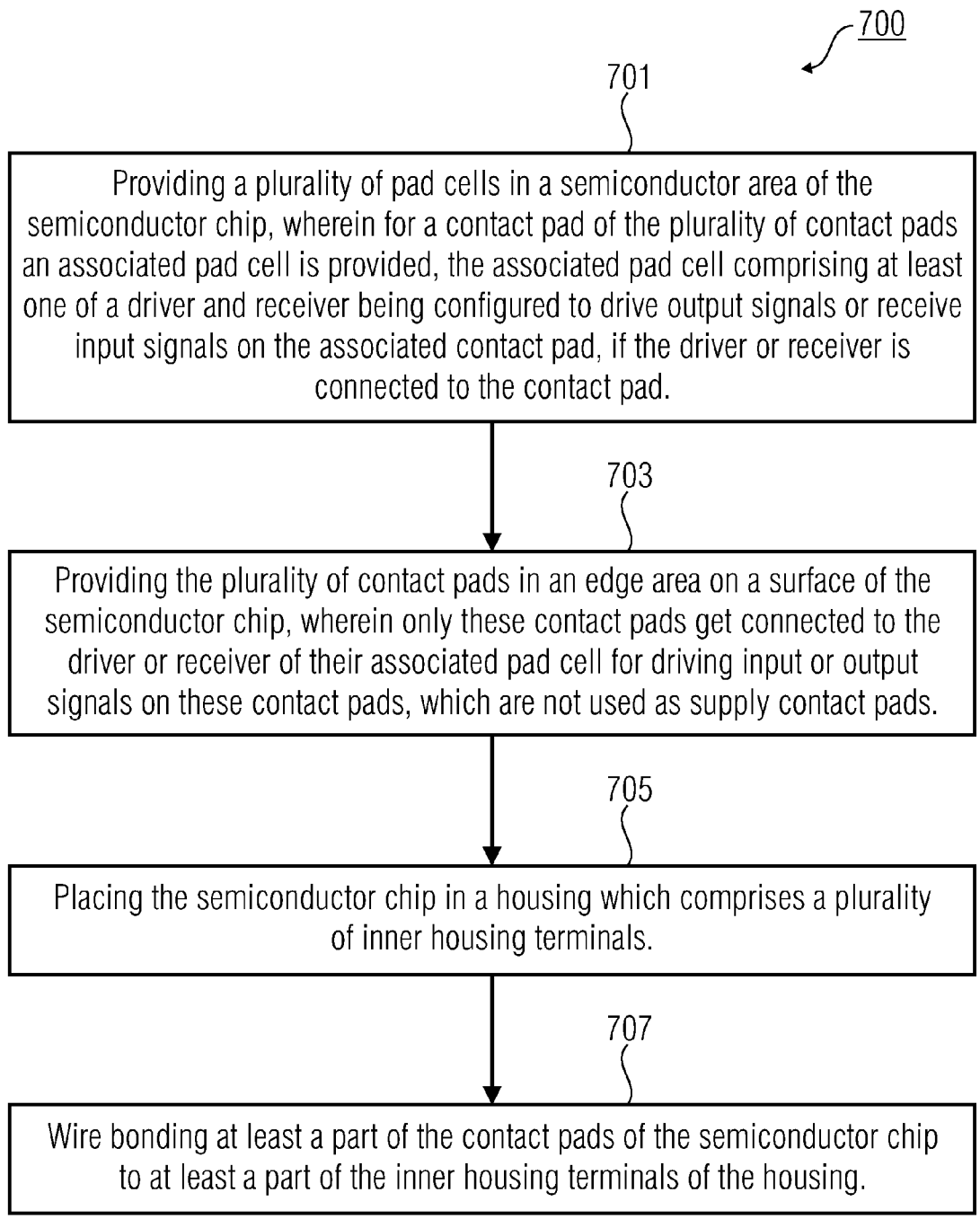
FIG. 7 is a flow diagram of a method for manufacturing a device according to an embodiment of the present invention.

FIG. 7 is a flow diagram showing a method 700 for manufacturing a device comprising a semiconductor chip with a plurality of contact pads. The method 700 can be, for example, used for manufacturing the device 500 shown in FIG. 5.

The method 700 includes a step 701 of providing a plurality of pad cells in a semiconductor area of a semiconductor chip, wherein for a contact pad (or every contact pad) of the plurality of contact pads, an associated pad cell is provided. The associated pad cell includes at least one of a driver and receiver configured to drive output signals or receive input signals on the associated contact pad if the driver or receiver is connected to the contact pad.

Additionally, the method 700 includes a step 703 of providing the plurality of contact pads in an edge area on a surface of the semiconductor chip. These contact pads get connected to the driver or receiver of their associated pad cells for driving output signals or receiving input signals on these contact pads, which are not used as supply contact pads.

Furthermore, the method 700 includes a step 705 of placing the semiconductor chip in a housing which comprises a plurality of inner housing terminals.

Additionally, the method 700 includes a step 707 of wire bonding at least a part of the contact pads of the semiconductor chip to at least a part of the inner housing terminals of the housing.

The methods 600, 700 may be supplemented by any of the features and functionalities described herein with respect to the apparatus, chips, and devices shown above, and may be implemented using some or all of the hardware components described above.

Although some aspects or embodiments have been described in the context of an apparatus, chip or device, it is understood that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

Depending on certain implementation requirements, embodiments of the invention can be implemented in hardware or in software. The implementation can be performed using a digital storage medium, for example a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, it is appreciated that embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are preferably performed by any hardware apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

Although each claim only refers back to one single claim, the disclosure also covers any conceivable suitable combination of claims.

The invention claimed is:

1. A method for manufacturing a semiconductor chip comprising a plurality of contact pads, the method comprising the following steps:
   providing for every contact pad of the plurality of contact pads an associated pad cell in a semiconductor area of the semiconductor chip, the associated pad cell comprising at least one of a driver and a receiver being configured to drive output signals or receive input signals on its associated contact pad, if the driver or receiver of the associated pad cell is connected to its associated contact pad; and
   providing the plurality of contact pads in an edge area on a surface of the semiconductor chip, wherein at least one contact pad of the plurality of contact pads is used as a supply contact pad, wherein the driver or receiver of the pad cells associated with the supply contact pad is not connected to the supply contact pad or any other contact pad of the plurality of contact pads for driving output signals or receiving input signals on these contact pads, and wherein the contact pads of the plurality of contact pads other than the at least one supply contact pad are connected to the driver or receiver of the associated pad cells for driving output signals or receiving input signals on these contact pads.

2. The method for manufacturing according to claim 1, wherein during the step of providing the plurality of contact pads further includes providing a plurality of through contacts, the plurality of through contacts being configured to route input or output signals from the pad cells to their associated contact pads or from the contact pads to their associated pad cells; and
   wherein the through contacts are only provided at pad cells which are not associated with contact pads used as supply contact pads.

3. A method for manufacturing a device comprising a semiconductor chip with a plurality of contact pads, the method comprising the following steps:
   providing for every contact pad of the plurality of contact pads an associated pad cell in a semiconductor area of the semiconductor chip, the associated pad cell comprising at least one of a driver and a receiver being configured to drive output signals or receive input signals on its associated contact pad, if the driver or receiver is connected to its associated contact pad;
   providing the plurality of contact pads in an edge area on a surface of the semiconductor chip, wherein at least one contact pad of the plurality of contact pads is used as a supply contact pad, wherein the driver or receiver of the pad cell associated with the supply contact pad is not connected to the supply contact pad or any other contact pad of the plurality of contact pads for driving output signals or receiving input signals on these contact pads, and wherein the contact pads of the plurality of contact pads other than the at least one supply contact pad are connected to the driver or receiver of the associated pad cells for driving output signals or receiving input signals on these contact pads;
   placing the semiconductor chip in a housing which comprises a plurality of inner housing terminals; and
   wire bonding at least a part of the contact pads of the semiconductor chip to at least a part of the inner housing terminals of the housing.

4. A device manufactured by a method comprising:
   providing a plurality of pad cells in a semiconductor area of the semiconductor chip, wherein for a contact pad of the plurality of contact pads an associated pad cell is provided, the associated pad cell comprising at least one of a driver and a receiver being configured to drive output signals or receive input signals on the associated contact pad, if the driver or receiver is connected to the contact pad;
   providing the plurality of contact pads in an edge area on a surface of the semiconductor chip, wherein only these contact pads get connected to the driver or receiver of their associated pad cell for driving output signals or receiving input signals on these contact pads, which are not used as supply contact pads;
   placing the semiconductor chip in a housing which comprises a plurality of inner housing terminals; and
   wire bonding at least a part of the contact pads of the semiconductor chip to at least a part of the inner housing terminals of the housing.

5. The device according to claim 4, further comprising forming a plurality of outer housing terminals and conductively connecting the plurality of outer housing terminal to the plurality of inner housing terminals, respectively.

6. The device according to claim 4, further comprising arranging the driver and/or receiver which are associated with the contact pads in an edge area of the semiconductor area.

7. The device according to claim 4, wherein for every contact pad of the plurality of contact pads the pad cell associated with the contact pad lies at least partially in a projection of the contact pad.

8. The device according to claim 4, further comprising connecting contact pads of the plurality of contact pads, which are used as input or output contact pads, by means of through contacts to the driver and/or receiver of their associated pad cells.

9. The device according to claim 8, wherein the through contacts extend from the contact pads which are used as input or output contact pads along a layer staple direction from the surface of the semiconductor chip to the semiconductor area of the semiconductor chip to the associated pad cells.

10. The device according to claim 4, wherein the contact pad which is used as supply contact pad is coupled with at least a first driver or receiver of the pad cells of the semiconductor chip, for providing a supply potential to this first driver or receiver.

11. The device according to claim 10, wherein the first driver or receiver is comprised in a pad cell associated to a further contact pad which is used as input or output contact pad and not as supply contact pad and the first driver or receiver is connected to the further contact pad, for driving output signals or receiving input signals on the further contact pad.

12. The device according to claim 4, further comprising coupling the contact pad which is used as supply contact pad with at least a first pad cell of the semiconductor chip, for providing a supply potential to the first pad cell; and wherein the first pad cell is associated with a further contact pad, which is used as a further supply contact pad; and wherein the driver or receiver of the first pad cell is not connected to the further contact pad or any other contact pad for driving output signals or receiving input signals on the same.

13. The device according to claim 4, further comprising coupling the contact pad which is used as supply contact pad to its associated pad cell for providing a supply potential to its associated pad cell.

14. The device according to claim 4, wherein the pad cell which is associated with the contact pad used as supply contact pad comprises an ESD protection circuit; and wherein the contact pad used as supply contact pad is coupled to the ESD protection circuit of its associated pad cell.

15. The device according to claim 4, further comprising connecting the receiver of the pad cell which is associated with the contact pad used as supply contact pad to the contact pad used as supply contact pad for sensing a voltage level of a supply voltage received at the contact pad used as supply contact pad.

16. The device according to claim 4, further comprising using the pad cell which is associated with the contact pad and a further pad cell, which both lie at least partially in a projection of the contact pad, as supply contact pad.

17. The device according to claim 16, wherein a driver or receiver of the further pad cell is not connected to the contact pad used as supply contact pad or to any other contact pads for driving output signals or receiving input signals on the same.

18. The device according to claim 4, wherein a number of pad cells in the semiconductor area is equal to or larger than a number of contact pads in the edge area on the surface of the semiconductor chip.

* * * * *